US010398067B2

(12) United States Patent
Lee et al.

(10) Patent No.: US 10,398,067 B2
(45) Date of Patent: Aug. 27, 2019

(54) MAGNETIC SHIELDING MEMBER AND WIRELESS POWER RECEIVER INCLUDING THE SAME

(71) Applicant: LG INNOTEK CO., LTD., Seoul (KR)

(72) Inventors: Dong Hyuk Lee, Seoul (KR); Ji Yeon Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 114 days.

(21) Appl. No.: 15/423,178

(22) Filed: Feb. 2, 2017

(65) Prior Publication Data
US 2017/0223878 A1 Aug. 3, 2017

(30) Foreign Application Priority Data

Feb. 3, 2016 (KR) .................. 10-2016-0013321

(51) Int. Cl.
H05K 9/00 (2006.01)
H02J 50/10 (2016.01)
H02J 7/02 (2016.01)

(52) U.S. Cl.
CPC ............ H05K 9/0075 (2013.01); H02J 7/025 (2013.01); H02J 50/10 (2016.02); H05K 9/0088 (2013.01)

(58) Field of Classification Search
None
See application file for complete search history.

(56) References Cited

U.S. PATENT DOCUMENTS

| 2010/0096181 A1* | 4/2010 | Nakamura | B32B 7/02 174/394 |
| 2012/0112552 A1* | 5/2012 | Baarman | H02J 7/025 307/104 |
| 2012/0236528 A1* | 9/2012 | Le | H05K 9/0088 361/818 |
| 2013/0249312 A1* | 9/2013 | Uchida | H01F 27/365 307/104 |
| 2013/0306364 A1* | 11/2013 | Suzuki | H05K 9/0088 174/394 |
| 2014/0177197 A1* | 6/2014 | Lampinen | H01F 27/365 361/818 |
| 2014/0239892 A1* | 8/2014 | Sawa | H01F 38/14 320/108 |
| 2014/0320369 A1* | 10/2014 | Azenui | H01Q 1/526 343/841 |
| 2015/0022020 A1* | 1/2015 | Borngraber | H02J 5/005 307/104 |
| 2015/0115723 A1* | 4/2015 | Levo | H01F 27/365 307/104 |
| 2015/0124402 A1* | 5/2015 | Jang | B32B 27/08 361/679.55 |
| 2015/0302971 A1* | 10/2015 | Wagman | H01F 27/2804 336/200 |

(Continued)

Primary Examiner — Kevin M Bernatz
(74) Attorney, Agent, or Firm — Birch, Stewart, Kolasch & Birch, LLP

(57) ABSTRACT

A wireless power receiver is disclosed. The wireless power receiver includes a reception coil for wirelessly receiving AC power, a plurality of shielding members disposed on the reception coil for blocking magnetism, and an adhesive member for adhering the shielding members and the reception coil to each other, wherein the shielding members are made of different materials.

18 Claims, 7 Drawing Sheets

(56) References Cited

U.S. PATENT DOCUMENTS

| | | | | |
|---|---|---|---|---|
| 2015/0302985 A1* | 10/2015 | Kurs | ................... | H01F 38/14 |
| | | | | 307/104 |
| 2015/0325362 A1* | 11/2015 | Kumura | ................ | H01F 38/14 |
| | | | | 336/84 M |
| 2015/0342099 A1* | 11/2015 | Jang | ..................... | H01F 1/16 |
| | | | | 174/350 |
| 2017/0178800 A1* | 6/2017 | Muratov | ............... | H01F 27/365 |
| 2018/0315534 A1* | 11/2018 | Jang | ..................... | H01F 10/20 |

\* cited by examiner

MAGNETIC SHIELDING MEMBER AND WIRELESS POWER RECEIVER INCLUDING THE SAME

CROSS REFERENCE TO RELATED APPLICATION

This application claims priority under 35 U.S.C. § 119 to Korean Patent Application No. 10-2016-0013321, filed in Korea on Feb. 3, 2016, which is hereby incorporated in its entirety by reference as if fully set forth herein.

TECHNICAL FIELD

Embodiments relate to wireless power transmission and, more particularly, to a magnetic shielding member exhibiting high magnetic shielding performance and magnetic permeability and a wireless power receiver including the same.

BACKGROUND

With the rapid development of information communication technology in recent years, we are moving toward a ubiquitous society based on such information communication technology.

In order to provide access to information communication devices anytime and anywhere, it is necessary to install sensors each having a computer chip capable of performing a communication function in all social facilities. Consequently, the supply of power to such devices and sensors is a new issue. In addition, as the variety of kinds of portable devices, such as a mobile phone, a Bluetooth headset and an iPod music player, have increased, it takes time and effort for users to charge batteries. In recent years, wireless power transfer has attracted attention as a method of solving this problem.

Wireless power transmission or wireless energy transfer refers to a technology of wirelessly transferring electric energy from a transmitter to a receiver using the principle of magnetic induction. In the 1800's, an electric motor or a transformer employing the principle of electromagnetic induction was used, and since then attempts to realize methods for transmitting electric energy by emitting electromagnetic waves, such as radio waves, lasers, high-frequency waves, and microwaves, have been made. In practice, electrical toothbrushes or electrical razors, which are frequently used in daily life, are charged based on the principle of electromagnetic induction.

Wireless energy transfer schemes used to date may be classified into a magnetic induction scheme, an electromagnetic resonance scheme, and a power transfer scheme using a short-wavelength radio frequency.

The magnetic induction scheme is a technology using a phenomenon in which when two coils are disposed adjacent to each other and current is supplied to one of the coil, a magnetic flux is generated, and as a result electromotive force is generated in the other coil. The magnetic induction scheme is being rapidly commercialized for small-sized devices such as mobile phones. The magnetic induction scheme has an advantage in that it is possible to transfer power of a maximum of several hundreds of kilowatts (kW) with high efficiency. However, the magnetic induction scheme has a disadvantage in that the maximum transfer distance is 1 cm or less and thus coils must be disposed adjacent to a charger or the bottom of a mobile phone.

The electromagnetic resonance scheme is characterized by using an electric field or a magnetic field instead of utilizing an electromagnetic wave or current. The electromagnetic resonance scheme has an advantage in that the electromagnetic resonance scheme is not affected by the electromagnetic wave and is thus safe for other electronic devices and human bodies. However, the electromagnetic resonance scheme has disadvantages in that the electromagnetic resonance scheme is useful only within a limited distance and space and in that energy transfer efficiency is somewhat low.

The short-wavelength wireless power transfer scheme, simply referred to as an RF scheme, utilizes the principle whereby energy can be directly transmitted and received in a radio-wave form. This technology is an RF wireless power transfer scheme using a rectenna. "Rectenna", which is a portmanteau word of "antenna" and "rectifier", means an element for directly converting RF power into DC power. That is, the RF scheme is technology for converting an AC radio wave into DC. In recent years, research has been actively conducted on commercialization of the RF scheme with improvement in efficiency of the RF scheme.

Wireless power transfer may be variously utilized in various industries, such as the vehicle, IT, railway, and electric home appliance industries, in addition to the mobile communication industry.

In general, a wireless power transmitter is provided with a coil for wireless power transfer (hereinafter, referred to as a transmission coil), and various shielding members are used to prevent an electromagnetic field or AC power generated by the transmission coil from being transferred to a control board.

A magnetic shielding sheet or a sandust block, which is formed of magnetic metal powder, is used as a representative shielding member.

In addition, for a wireless power receiver, a shielding member is used to block an electromagnetic field received by a reception coil.

In the case in which a single magnetic shielding member is used, however, the efficiency of shielding of an imaginary part is low, whereby energy is lost.

SUMMARY

Embodiments provide a magnetic shielding member for a wireless power receiver.

Further, embodiments provide a magnetic shielding member capable of solving the problem whereby energy is lost due to low efficiency of shielding of an imaginary part when a single magnetic shielding member is used and a wireless power receiver including the same.

It should be noted that objects of the disclosure are not limited to the objects mentioned above, and other unmentioned objects of the disclosure will be clearly understood by those skilled in the art to which the disclosure pertains from the following description.

In one embodiment, a wireless power receiver includes a reception coil for wirelessly receiving AC power, a plurality of shielding members disposed on the reception coil for blocking magnetism, and an adhesive member for adhering the shielding members and the reception coil to each other, wherein the shielding members are made of different materials.

The shielding members may include a first shielding member disposed on the reception coil and a second shielding member disposed on the first shielding member.

The first shielding member may be a magnetic shielding member, and the second shielding member may be a soft magnetic shielding member.

The first shielding member may be one selected from between a nano-crystal shielding member and an amorphous shielding member.

The first shielding member may have a thickness of 17 to 25 µm.

The first shielding member may have a diameter of 30 mm or less.

The second shielding member may be a sandust block formed by mixing and melting insulated flake powder and insulation resin powder.

The second shielding member may have a thickness of 0.1 mm or more.

The insulation resin powder may be a polyimide-based or phenol-based resin powder.

The reception coil may be one selected from between a patterned coil and a wound type coil.

In another embodiment, a wireless power receiver includes a reception coil for wirelessly receiving AC power, a shielding member disposed on the reception coil for blocking magnetism, and an adhesive member for adhering the shielding member and the reception coil to each other, wherein the adhesive member includes a first shielding member disposed on the reception coil and a second shielding member disposed on the first shielding member, and the first shielding member and the second shielding member are configured such that the efficiency of shielding of an imaginary part for the first shielding member and the efficiency of shielding of an imaginary part for the second shielding member are different from each other.

The first shielding member may be a sandust block formed by mixing and melting insulated flake powder and insulation resin powder.

The first shielding member may have a thickness of 0.1 mm or more.

The reception coil may be one selected from between a patterned coil and a wound type coil.

The first shielding member may be one selected from between a nano-crystal shielding member and an amorphous shielding member.

In a further embodiment, a wireless power receiver includes a reception coil for wirelessly receiving AC power, a first shielding member disposed on the reception coil for blocking magnetism, a first adhesive member disposed between the first shielding member and the reception coil for adhering the first shielding member and the reception coil to each other, a second shielding member disposed on the first adhesive member for blocking magnetism, and a second adhesive member disposed between the first shielding member and the second shielding member for adhering the first shielding member and the second shielding member to each other, wherein, when the first shielding member is a magnetic shielding member or a soft magnetic shielding member, the second shielding member is a soft magnetic shielding member or a magnetic shielding member.

When the first shielding member or the second shielding member is a soft magnetic shielding member, the shielding member may have a thickness of 0.1 mm or more.

When the first shielding member or the second shielding member is a soft magnetic shielding member, the shielding member may be a sandust block formed by mixing and melting insulated flake powder and insulation resin powder.

When the first shielding member or the second shielding member is a magnetic shielding member, the shielding member may be one selected from between a nano-crystal shielding member and an amorphous shielding member.

When the first shielding member or the second shielding member is a magnetic shielding member, the shielding member may have a thickness of 17 to 25 µm.

The above aspects of the disclosure are merely some of the preferred embodiments, and various embodiments into which the technical features are incorporated may be derived and understood by those skilled in the art from the detailed description which follows.

BRIEF DESCRIPTION OF THE DRAWINGS

The accompanying drawings are provided to assist in the understanding of the embodiments, and provide the embodiments along with a detailed description. However, the technical features of the embodiments are not limited to particular drawings, and the features illustrated in the respective drawings may be combined with each other so as to configure new embodiments.

Arrangements and embodiments may be described in detail with reference to the following drawings in which like reference numerals refer to like elements and wherein.

DESCRIPTION OF SPECIFIC EMBODIMENTS

Figure 1:
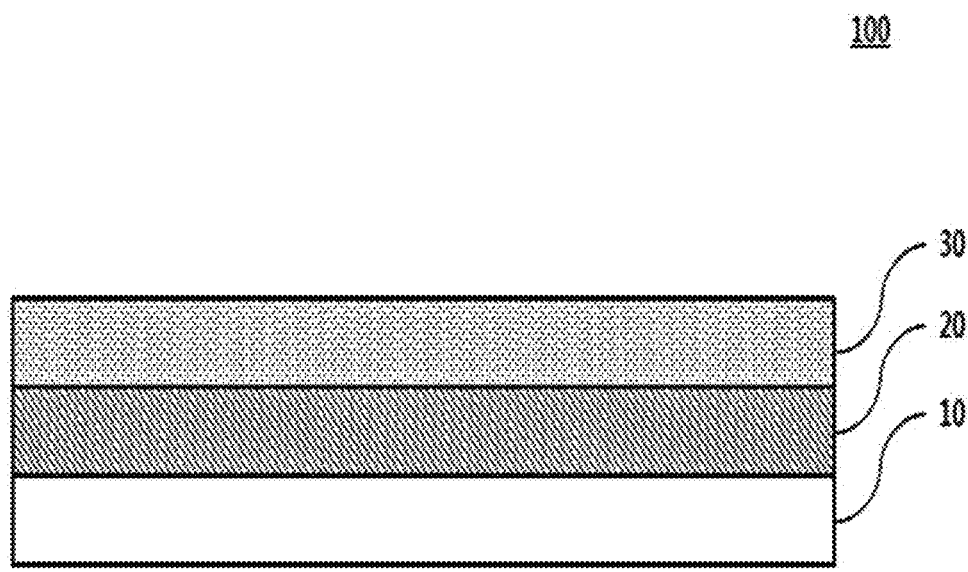
FIG. 1 is a view schematically showing the structure of a wireless power reception module according to an embodiment.

Reference will now be made in detail to the preferred embodiments, examples of which are illustrated in the accompanying drawings. The suffixes "module" and "unit" of elements herein are used for convenience of description and thus can be used interchangeably and do not have any distinguishable meanings or functions.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the description of the embodiments, an apparatus that transmits wireless power in a wireless power transfer system may also be referred to as a wireless power transmitter, a wireless power transmission apparatus, a transmission end, a transmitter, a transmission apparatus, a transmission side, or a wireless power transfer apparatus for the convenience of description. In addition, an apparatus that wirelessly receives power from the wireless power transmission apparatus may also be referred to as a wireless power reception apparatus, a wireless power receiver, a reception terminal, a reception side, a reception apparatus, or a receiver for the convenience of description.

A wireless power transmitter according to an embodiment may be configured in the form of a pad, a cradle, an Access Point (AP), a small base station, a stand, or a cup, or may be of a ceiling-mounted type or a wall-mounted type. One transmitter may transfer power to a plurality of wireless power reception apparatuses. To this end, the wireless power transmitter may include at least one wireless power transfer unit. Here, the wireless power transfer unit may use various wireless power transfer standards based on an electromagnetic induction charging method using the principle of electromagnetic induction, in which a power transmission-end coil generates a magnetic field so that electricity is induced in a reception-end coil under the influence of the magnetic field. Here, the wireless power transfer unit may include an electromagnetic induction type wireless charging technology defined by the Wireless Power Consortium (WPC) and the Power Matters Alliance (PMA), which are wireless charging technology standardization organizations.

A wireless power transmitter according to another embodiment may use various wireless power transfer standards based on an electromagnetic resonance method. Examples of electromagnetic resonance type wireless power transfer standards may include an induction type wireless charging technology defined by the Alliance for Wireless Power (A4WP).

A wireless power transmitter according to a further embodiment may use both the electromagnetic induction method and the electromagnetic resonance method.

In addition, a wireless power receiver according to an embodiment may include at least one wireless power reception unit, and may simultaneously receive wireless power from two or more transmitters. Here, the wireless power reception unit may include an electromagnetic induction type wireless charging technology defined by the Wireless Power Consortium (WPC) and the Power Matters Alliance (PMA), which are wireless charging technology standardization organizations, and an electromagnetic resonance type wireless charging technology defined by the Alliance for Wireless Power (A4WP).

FIG. 1 is a view schematically showing the structure of a wireless power reception module according to an embodiment.

Referring to FIG. 1, a wireless power reception module 100 may have a layered structure including a reception coil 10, an adhesive member 20, and a magnetic shielding member 30.

The reception coil 10 receives a power signal transmitted through a transmission coil of a wireless power transmitter. For example, the reception coil 10 may be a patterned coil having a thin wire pattern formed on a film or a thin printed circuit board or a wound type coil formed by winding an insulated coil. However, this is merely an embodiment. The shape of the reception coil is not particularly restricted, as long as the reception coil is capable of receiving wireless power.

The reception coil 10 may be formed on at least one surface of a coil substrate in the shape of a wire pattern.

Both ends of the reception coil 10 may be electrically connected to a control circuit board (not shown). Here, the coil substrate may be an insulative substrate. The coil substrate may be a printed circuit board (PCB), a ceramic substrate, a pre-molded substrate, a direct bonded copper (DBC) substrate, or an insulated metal substrate (IMS). However, the disclosure is not limited thereto. All substrates exhibiting insulation characteristics may be used. In addition, the coil substrate may be a flexible substrate exhibiting elasticity.

The adhesive member 20 adheres the reception coil 10 and the shielding member 30 to each other. The adhesive member 20 may be constituted by double-sided tape. However, the disclosure is not limited thereto. In FIG. 1, the adhesive member 20 is shown as being attached over one surface of the reception coil 10 and one surface of the shielding member 30. However, this is merely an embodiment. The adhesive member 20 may be attached to a portion of one surface of the reception coil 10 and a portion of one surface of the shielding member 30. For example, the adhesive member 20 may be formed in a circular ring shape. However, the disclosure is not limited thereto. The shape of the adhesive member 20 is not particularly restricted as long as the adhesive member 20 is capable of adhering the reception coil 10 and the shielding member 30 to each other.

In FIG. 1, the adhesive member 20 is shown as being a double-sided adhesive sheet. However, this is merely an embodiment. In another embodiment, the adhesive member 20 may be an adhesive or an adhesive resin that is applied to one surface of the reception coil 10 and the shielding member 30.

The reception coil 10, which is formed on the coil substrate, may have a diameter of 30 mm or less. In the case in which it is necessary for the reception coil 10 to have a diameter of 25 mm or less, the reception coil 10 may be constituted by a wound type coil, rather than a patterned coil. In general, the wound type coil has lower resistance than the patterned coil. Consequently, wireless power reception efficiency may be improved. In general, if the resistance of the reception coil 10 is high, power loss may be increased due to generation of heat attributable to the resistance. In the case in which the diameter of the reception coil 10 is decreased, therefore, the wound type coil may be used in order to minimize a loss rate.

In the case in which the reception coil 10 is a wound type coil, a wire constituting the wound type coil may have a diameter of 1.15 to 0.25 mm.

By the way of example but not limitation, the shielding member 30 may include at least two magnetic shielding members, e.g., first and second magnetic shielding members. A ferrite-based non-conductive shielding member may be used as the shielding member 30. For example, Ni—Zn—Cu ferrite exhibiting high permeability and a low power loss rate may be used as the ferrite-based magnetic shielding member. Here, the permeability of the shielding member 30 made of Ni—Zn—Cu ferrite is characterized in that a real part has a value of 300 or less and an imaginary part has a value of 20 or less in a low-frequency band (i.e. a band of 300 KHz or less).

In another embodiment, an Ni—Zn or Mn—Zn non-conductive shielding member may be used as the shielding member 30.

In a further embodiment, a nano-crystal or amorphous (such as a-Si) conductive shielding member may be used as the shielding member 30.

In general, the ferrite-based non-conductive shielding member exhibits high efficiency of shielding of an imaginary part of an AC signal received by the reception coil 10, whereas the nano-crystal or amorphous conductive shielding member exhibits high efficiency of shielding of a real part of an AC signal received by the reception coil 10.

In the case in which only the nano-crystal or amorphous conductive shielding member is used as the shielding member 30, as described above, the efficiency of shielding the real part of the AC signal is high, but the efficiency of shielding the imaginary part of the AC signal is low, which leads to a reduction in efficiency.

In a wireless charging system, permeability is directly related to wireless power transfer efficiency. In the case in which a sandust block according to an embodiment exhibits high magnetic field shielding efficiency, the permeability of electromagnetic waves transferred from a transmission coil (i.e. a primary coil) to a reception coil (i.e. a secondary coil) of a reception end may be high. That is, the sandust block is used as a core material for increasing the coefficient of coupling between the primary coil and the secondary coil.

In the case in which the magnetic field shielding efficiency of the sandust block is low, the magnetic flux generated by the transmission coil may be transferred to a control board in the wireless power transmitter, and heat may be generated in the wireless power transmitter due to an eddy current generated by electromagnetic flow, which may damage the wireless power transmitter. Furthermore, large-scale power transmission is interrupted, with the result that charging time is increased.

Consequently, the performance of the sandust block, which is a magnetic shielding member, may greatly affect the safety and charging efficiency of a device.

Permeability may be increased in proportion to the magnetic field shielding efficiency of the sandust block.

However, the wireless power receiver shown in FIG. 1 uses a single shielding member, with the result that power may be lost.

More specifically, in the case in which only a single magnetic shielding sheet is used as the shielding member 30, the imaginary part term of the permeability of the magnetic shielding sheet is high, with the result that shielding efficiency is reduced.

In addition, the magnetic shielding sheet is easily saturated by a permanent magnet. In the case in which only a single magnetic shielding sheet is used as the shielding member 30, therefore, shielding efficiency is reduced by a permanent magnet provided in the wireless power transmitter.

Another embodiment is proposed in order to solve the above problems.

Figure 2A:
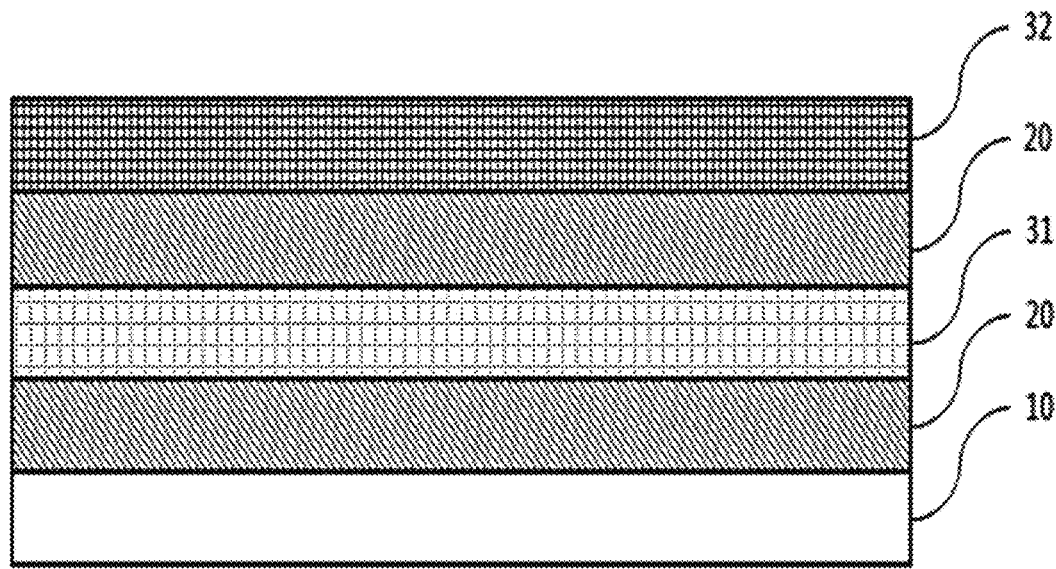
FIGS. 2a and 2b are views showing the structure of a wireless power reception module according to another embodiment.
Figure 2B:
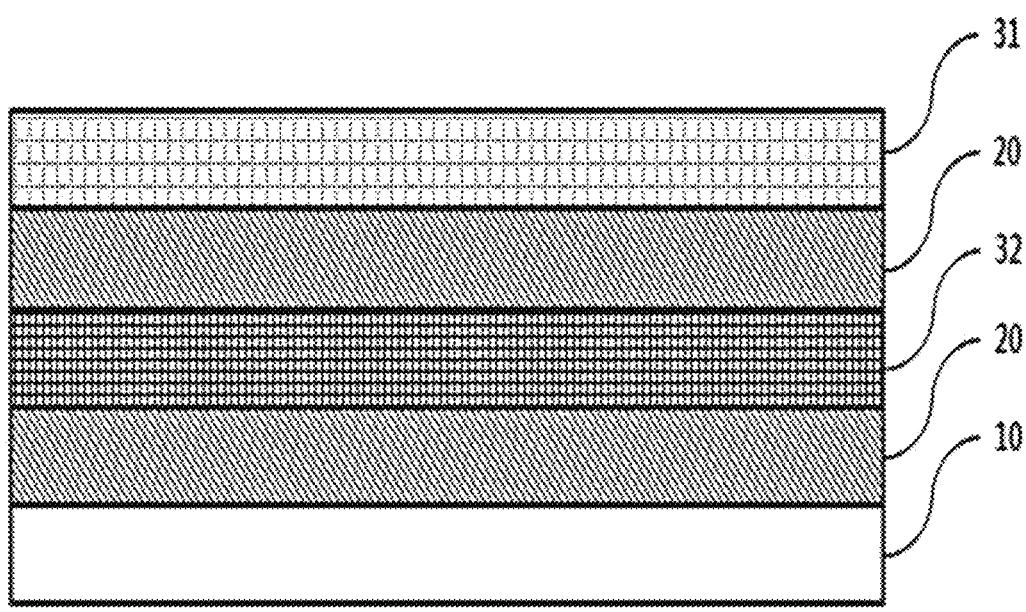

FIGS. 2a and 2b are views showing the structure of a wireless power reception module according to another embodiment.

Referring to FIGS. 2a and 2b, a shielding member 30 according to this embodiment may include a plurality of shielding member 31 and 32.

The wireless power receiver may include a reception coil 10 for receiving power supplied by a wireless power transmitter, a first shielding member 31 disposed on the reception coil 10 for blocking magnetism generated by the reception coil 10, and a second shielding member 32 disposed on the first shielding member 31 for blocking magnetism generated by the reception coil 10.

The wireless power receiver may further include an adhesive member 20 disposed between the reception coil 10 and the first shielding member 31 and another adhesive member 20 disposed between the first shielding member 31 and the second shielding member 32.

The adhesive member 20 disposed between the reception coil 10 and the first shielding member 31 may adhere the reception coil 10 and the first shielding member 31 to each other, and the adhesive member 20 disposed between the first shielding member 31 and the second shielding member 32 may adhere the first shielding member 31 and the second shielding member 32 to each other.

The first shielding member 31 and the second shielding member 32 may be different from each other in terms of material.

For example, the first shielding member 31 may be a magnetic shielding member, and the second shielding member 32 may be a soft magnetic shielding member, such as a sandust block.

The second shielding member 32, which is a soft magnetic shielding member, may have a thickness of 0.1 mm or more.

The reason for this is that if the thickness of the second shielding member 32 is less than 0.1 mm, the second shielding member 32 is not capable of blocking magnetism.

Table 1 below shows the charging efficiency of the wireless power receiver in the case in which one of the first and second shielding members 31 and 32 is a magnetic shielding member and the other is a soft magnetic shielding member and the charging efficiency of the wireless power receiver in the case in which only a single conductive shielding member is used.

TABLE 1

| Shielding member | PMA-1 | PMA-3 | WPC A1 | WPC A6 | WPC A10 | WPC A11 |
|---|---|---|---|---|---|---|
| Single conductive shielding member | 70.2% | 76.3% | 70.6% | 72.1% | 73.2% | 73.8% |
| Conductive shielding member + Soft magnetic shielding member | 70.4% | 77.0% | 73.1% | 73.6% | 76.3% | 76.2% |

Referring to Table 1 above, it can be seen that in the case in which one of the first and second shielding members 31 and 32 is a conductive shielding member and the other is a soft magnetic shielding member, as shown in FIG. 2, the charging efficiency of the wireless power receiver is higher than in the case in which only a single conductive shielding member is used, as shown in FIG. 1.

That is, in the case in which a plurality of shielding members made of different materials is used, specifically the first shielding member 31 and the second shielding member 32 are used, it is possible to more efficiently block magnetism generated by the reception coil 10.

Alternatively, the first shielding member 31 and the second shielding member 32 may be made of the same material.

For example, the first shielding member 31 may be a conductive shielding member, and the second shielding member 32 may also be a conductive shielding member.

However, the above embodiment is illustrated for the convenience of description. Three or more shielding members may be provided as needed, without limiting the scope of rights of this disclosure.

Figure 3:
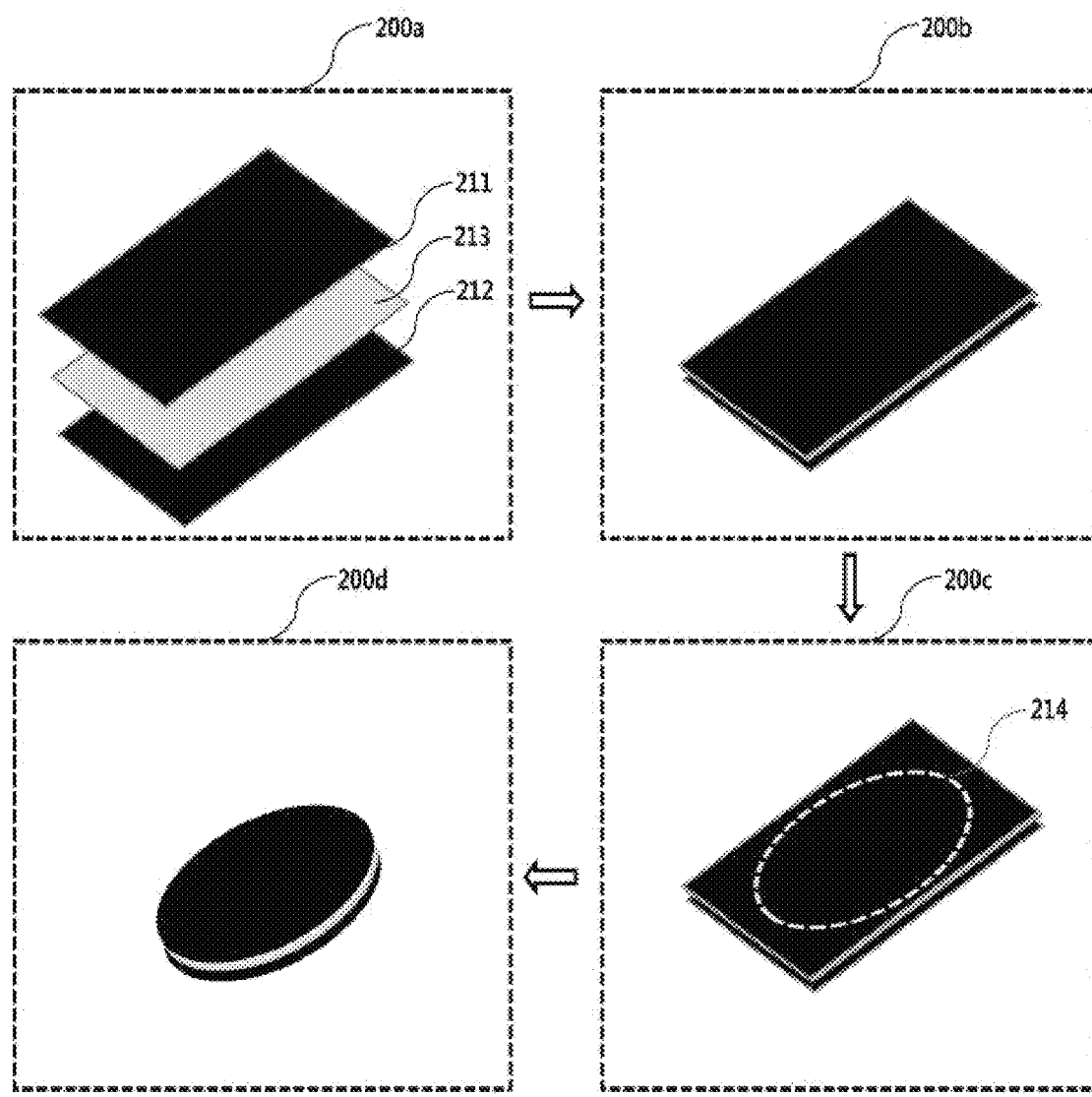
FIG. 3 is a process view schematically illustrating a method of manufacturing a non-conductive magnetic shielding member according to an embodiment.

FIG. 3 is a process view schematically illustrating a method of manufacturing a non-conductive magnetic shielding member according to an embodiment.

Referring to FIG. 3, the non-conductive magnetic shielding member may include a non-conductive magnetic shielding sheet 213, a first cover tape 211 disposed on one surface of the non-conductive magnetic shielding sheet 213, and a second cover tape 212 disposed on the other surface of the non-conductive magnetic shielding sheet 213. Here, each of the first cover tape 211 and the second cover tape 212 may be a PET-based double-sided adhesive tape, and may fix the non-conductive magnetic shielding sheet 213, which is fragile.

As indicated by reference symbol 200b, the first and second cover tapes 211 and 212 are attached to the non-conductive magnetic shielding sheet 213. Subsequently, as indicated by reference symbol 200c, a cutting region 214 is marked on one surface of the laminate, and the cutting region 214 is cut to obtain a non-conductive magnetic shielding member as indicated by reference symbol 200d. As indicated by reference symbol 200c, the cutting region 214 is circular. However, this is merely an embodiment. The shape and size of the cutting region 214 may be changed depending on the shape and size of the reception coil.

In general, a ferrite shielding member is fragile, and permeability may be changed depending on the broken pattern and extent of the shielding member. The non-conductive magnetic shielding sheet 213 may be broken in a predetermined pattern such that the non-conductive magnetic shielding sheet 213 has desired permeability. The first and second cover tapes 211 and 212 are used to maintain the pattern of the non-conductive magnetic shielding sheet 213. The first and second cover tapes 211 and 212 may exhibit insulativity. Hereinafter, the cover tape, which is used to manufacture the conductive magnetic shielding member, will be used interchangeably with the term "insulative cover tape" for the convenience of description.

In addition, the first and second cover tapes 211 and 212 are used to enable the non-conductive magnetic shielding member to be flexible. Consequently, the non-conductive magnetic shielding member may exhibit durability against external impact.

Figure 4:
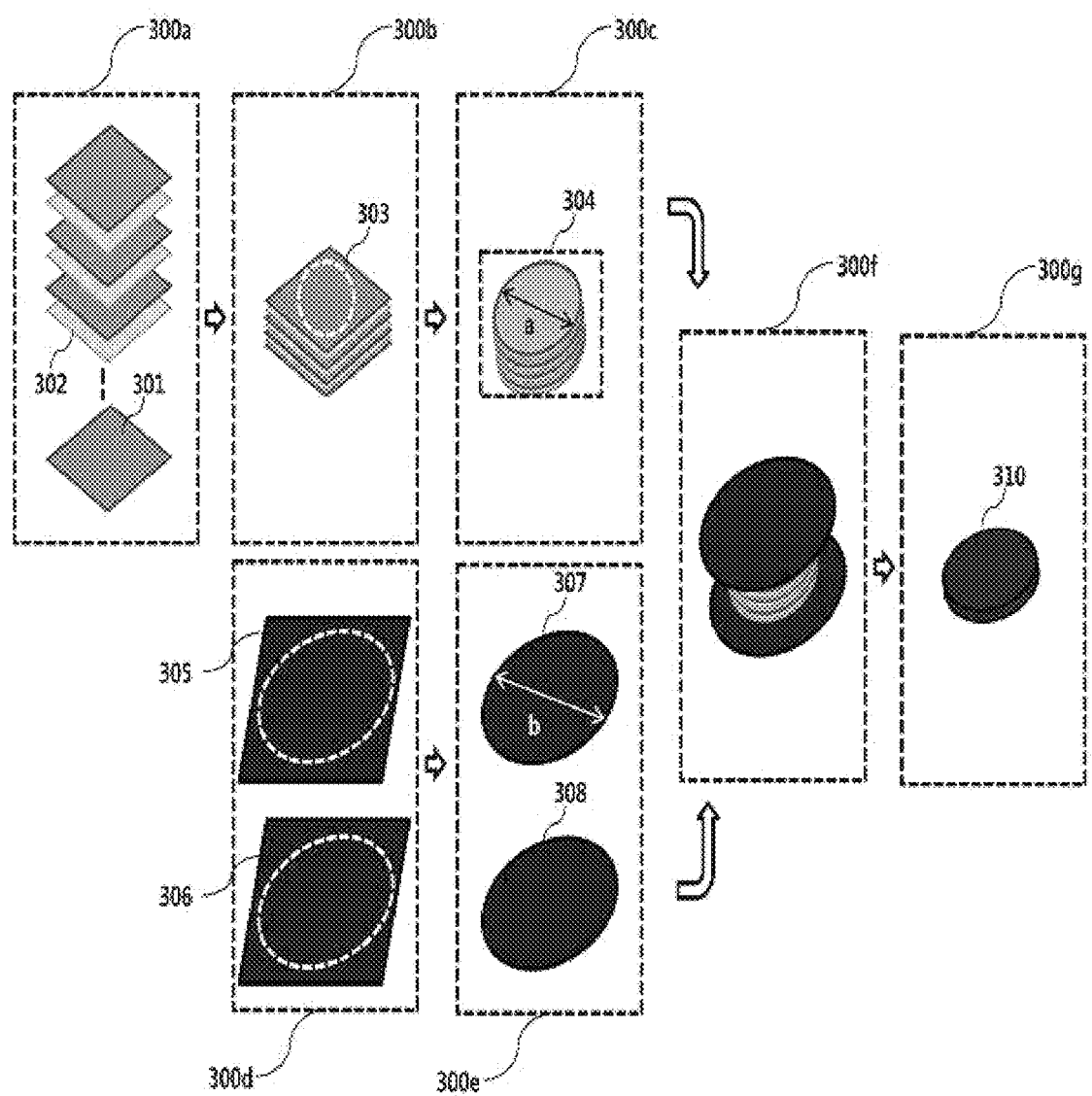
FIG. 4 is a process view illustrating a method of manufacturing a conductive magnetic shielding member according to an embodiment.

FIG. 4 is a process view illustrating a method of manufacturing a conductive magnetic shielding member according to an embodiment.

As indicated by reference symbols 300a and 300b of FIG. 4, n conductive magnetic shielding sheets 301 may be attached to each other in the state in which n−1 adhesive members 302 are respectively disposed therebetween, whereby conductive magnetic shielding sheets 301 may be laminated. Here, n may be a natural number of 2 or more. Each of the conductive magnetic shielding sheets 301 may be a nano-crystal or amorphous shielding sheet, and may have a thickness of 17 to 25 μm. Consequently, the number of conductive magnetic shielding sheets that are included in the conductive magnetic shielding member in order to obtain desired permeability may be changed depending on the permeability required by the wireless charging system or the wireless power reception module.

Subsequently, as indicated by reference symbols 300b and 300c, a cutting region 303 may be marked on one surface of the laminate, and the cutting region 303 may be cut. Here, marking and cutting of the cutting region 303 may be performed manually or using a programmed robot. The shape and size of the cutting region 303 may be determined depending on the shape and size of the reception coil in the wireless power reception module.

Hereinafter, a conductive shielding member obtained through laminating and cutting, as indicated by reference symbols 300a to 300c, will be referred to as a first block 304 for the convenience of description. At this time, the first block 304 may have a diameter of a.

As indicated by reference symbols 300d and 300e, first and second cover sheets 305 and 306 may be cut to obtain first and second cover tapes 307 and 308 each having a diameter of b.

At this time, the diameter b of the cut cover tapes 307 and 308 is greater than the diameter a of the first block 304. For example, the diameter b of the cut cover tapes 307 and 308 may be determined depending on the diameter a of the first block 304 and the number n of conductive magnetic shielding sheets included in the conductive magnetic shielding member. That is, the diameter b of the cut cover tapes 307 and 308 may be increased as the number of conductive magnetic shielding sheets is increased.

As indicated by reference symbol 300f, the cut first and second cover tapes 307 and 308 may be attached to the upper and lower surfaces of the first block 304, respectively, and then the edges of the first and second cover tapes 307 and 308 may be pushed toward the cut surface of the first block 304. As a result, as indicated by reference symbol 300g, all surfaces of the first block 304 may be wrapped by the cover tapes, whereby an insulative magnetic shielding member 310 may be obtained.

Figure 5:
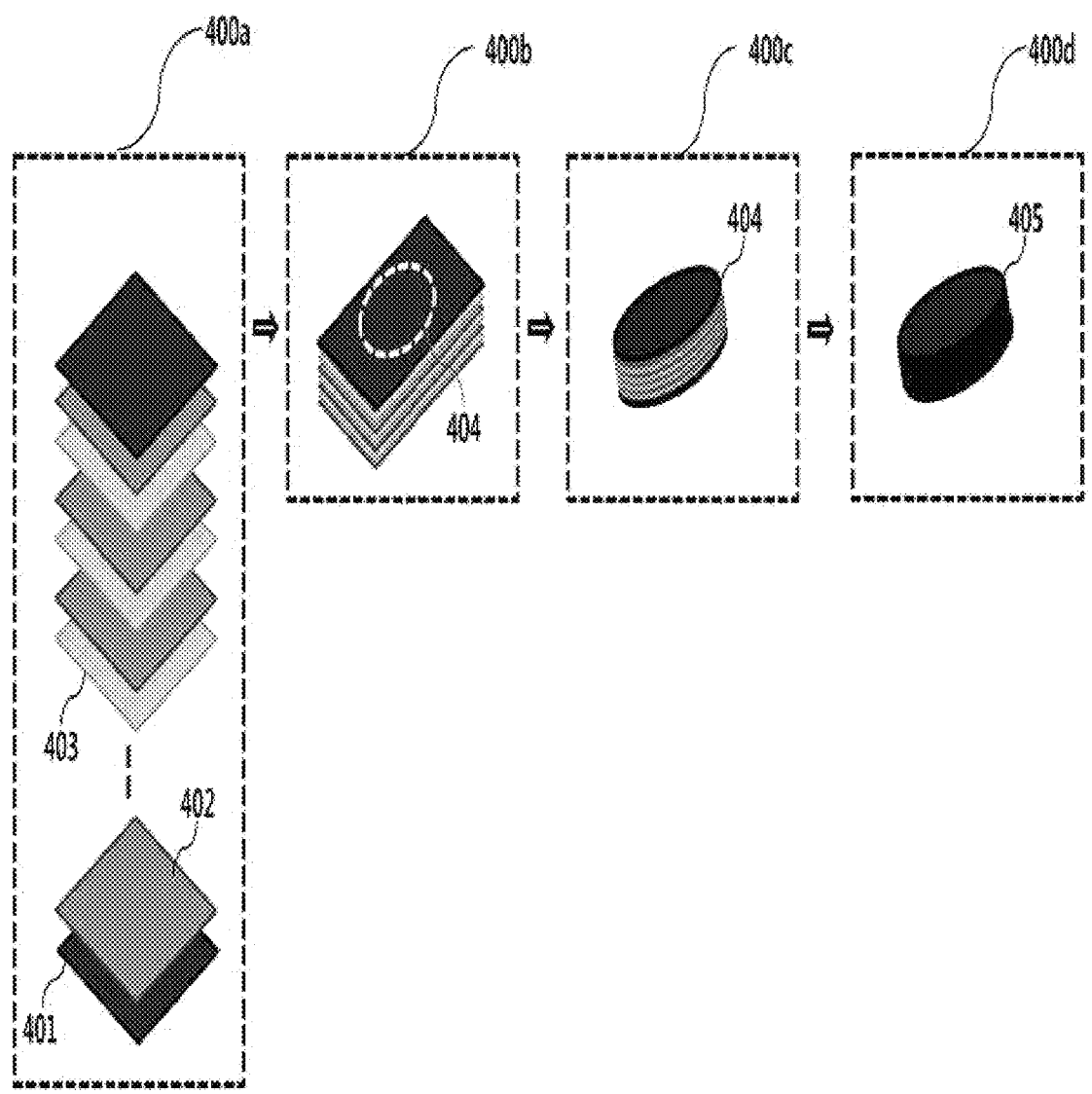
FIG. 5 is a process view illustrating a method of manufacturing a conductive magnetic shielding member according to another embodiment.

FIG. 5 is a process view illustrating a method of manufacturing a conductive magnetic shielding member according to another embodiment.

As indicated by reference symbol 400a of FIG. 5, n conductive magnetic shielding sheets 402 may be attached to each other in the state in which n−1 adhesive members 403 are respectively disposed therebetween, and insulative cover tapes 401 may be attached to the outermost ones of the conductive magnetic shielding sheets.

After the n conductive magnetic shielding sheets 402 are laminated, as indicated by reference symbol 400a, a marked cutting region 404 is cut, as indicated by reference symbol 400b, whereby a first block 404 may be obtained, as indicated by reference symbol 400c. At this time, in order to insulate the cut surface of the first block 404, an insulative coating agent may be applied to the cut surface of the first block 404, whereby a conductive shielding block 405, all surfaces of which have been insulated, may be obtained, as indicated by reference symbol 400d.

Figure 6:
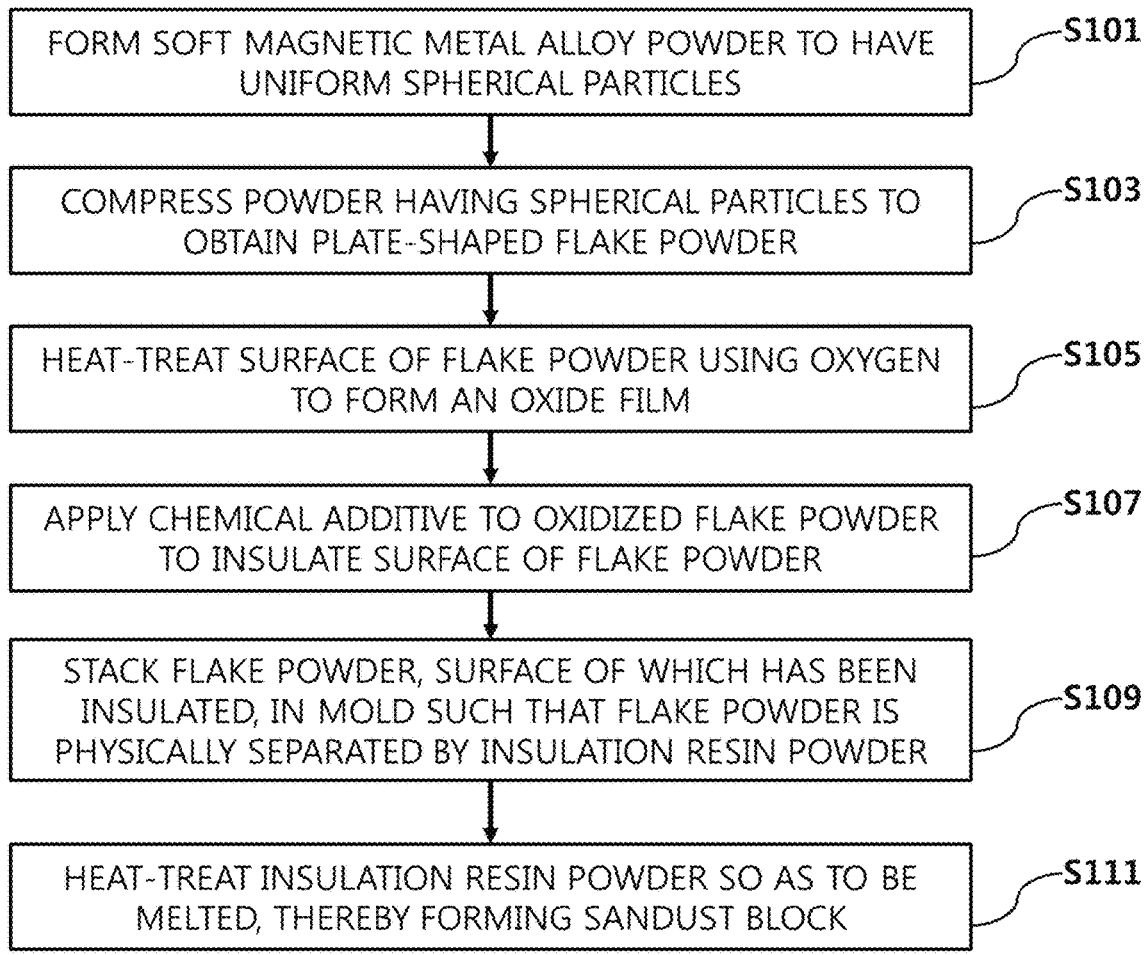
FIG. 6 is a flowchart schematically illustrating a method of manufacturing a sandust block according to an embodiment.

FIG. 6 is a flowchart schematically illustrating a method of manufacturing a sandust block according to an embodiment.

Soft magnetic metal alloy powder, which is used to manufacture the sandust block, may be obtained by mechanically pulverizing a ribbon manufactured under high-speed cooling using a single rolling process, which is a conventional rapid solidification process (RSP), or using high-pressure water atomization. In another example, soft magnetic metal alloy powder may be obtained by allowing an alloy raw material melted in a furnace to naturally drop through a nozzle provided at one side of the lower end of the furnace and spraying a high-pressure inert cooling gas, such as nitrogen $N_2$, helium He, neon Ne, or argon Ar, to the molten material while the molten material drops such that the molten material is rapidly cooled. However, this is merely an embodiment. Soft magnetic metal alloy powder may be obtained using various other methods.

Referring to FIG. 6, soft magnetic metal alloy powder having uniform spherical particles may be obtained using high-pressure water atomization or high-pressure gas atomization (S101).

The soft magnetic metal alloy powder having spherical particles may be compressed to obtain plate-shaped flake powder (S103). The flake-shaped metal powder is suitable for improving the density of metal particles of the sandust block. Furthermore, in the case in which the flake-shaped metal powder is uniformly arranged in the sandust block in the horizontal direction, the flow or a magnetic field is induced in the horizontal direction, whereby magnetic characteristics are maximized in the horizontal direction.

The surface of the obtained plate-shaped flake powder may be heat-treated using oxygen to form an oxide film (S105). In general, the electrical resistance of soft magnetic metal alloy powder is low. If metal powder particles are not insulated from one another, and therefore the metal alloy particles contact one another, a short may occur due to the flow of current.

In order to solve the above problem, a chemical additive for surface insulation may be applied to the oxidized flake powder (S107). In general, the surface of metal alloy powder is physically or chemically stabilized by metal bonding, with the result that bonding between the metal alloy powder and other additives is not easy. In order to induce bonding between the metal alloy powder and the chemical additive, therefore, the surfaces of the metal alloy particles may be oxidized at step S105. Micro oxygen heat treatment may be performed on the surface of the flake powder, whereby a thin oxide film is formed on the surface of the flake powder. The oxide film may exhibit insulativity. When the oxide film is formed on the surface of the flake powder, bonding between ions located on the outermost surface of the flake powder and oxygen ions is performed, whereby the surface of the flake powder is unstable. As a result, a chemical additive for surface insulation may be easily bonded to the flake powder. A silicon (Si)-based, calcium (Ca)-based, and zinc (Zn)-based chemical additive, such as phosphate, kaolin, talc, magnesium hydroxide, aluminum oxide ($Al_2O_3$), zinc stearate, magnesium stearate, and water glass, may be used as the chemical additive for insulating the surface of the flake powder. However, the disclosure is not limited thereto.

The flake powder, the surface of which has been insulated, and insulation resin powder may be stacked in a mold such that the flake powder is physically separated by the insulation resin powder (S109). Here, the insulation resin powder is used to improve insulation between the flake powder and bonding at the time of forming a sandust block. Polyimide-based or phenol-based resin powder may be used as the insulation resin powder. However, the disclosure is not limited thereto.

In particular, a material exhibiting high bondability may be used as the chemical additive and the insulation resin powder, which are used to insulate the surface of the flake powder.

Subsequently, the stacked insulation resin powder may be heat-treated so as to be melted, whereby a sandust block may be formed (S111).

However, the above embodiment is illustrated for the convenience of description. The sandust block may be manufactured using various other methods as needed, without limiting the scope of rights of this disclosure.

Figure 7:
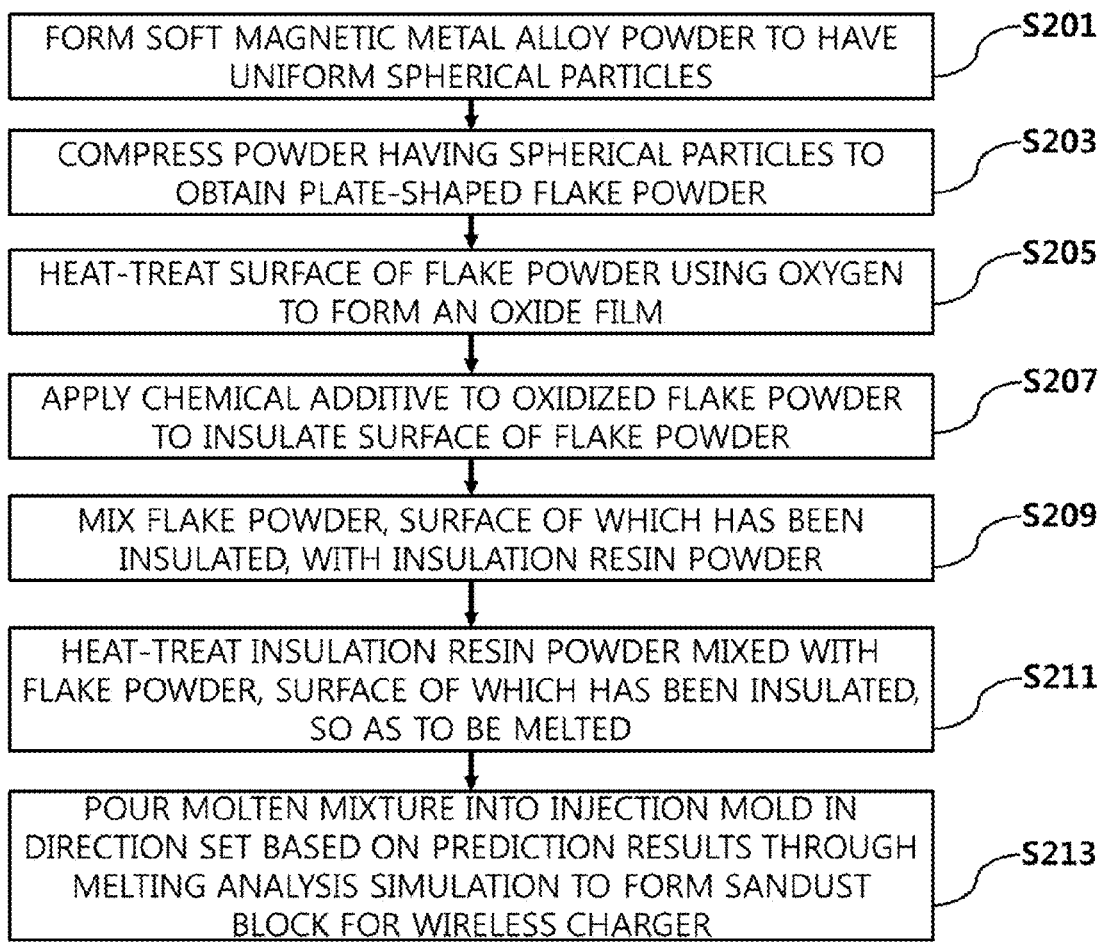
FIG. 7 is a flowchart schematically illustrating a method of manufacturing a sandust block according to another embodiment.

FIG. 7 is a flowchart schematically illustrating a method of manufacturing a sandust block according to another embodiment.

Referring to FIG. 7, soft magnetic metal alloy powder having uniform spherical particles may be obtained using high-pressure water atomization or high-pressure gas atomization (S201).

The soft magnetic metal alloy powder having spherical particles may be compressed to obtain plate-shaped flake powder (S203).

The surface of the obtained plate-shaped flake powder may be heat-treated using oxygen to form an oxide film (S205).

A chemical additive for surface insulation may be applied to the oxidized flake powder (S207).

The flake powder, the surface of which has been insulated, and insulation resin powder may be mixed, and the mixture may be heat-treated in a furnace such that the mixture is melted (S209 and S211).

Subsequently, the molten mixture may be poured into an injection mold in a direction set based on prediction results through melting analysis simulation to form a sandust block (S213). Here, the injection mold may be formed in the shape of a sandust block that is used to constitute the wireless power transmitter. A terminal for connecting a transmission coil and a sensing circuit mounted in the wireless power transmitter to a control circuit board may be integrally formed at the injection-molded sandust block. The transmission coil and the sensing circuit may be connected to one side of the terminal, and the control circuit board may be connected to the other side of the terminal. Consequently, the transmission of power by the transmission coil may be controlled by the control circuit board. In addition, information sensed by the sensing circuit, including a temperature sensing circuit and a voltage/current sensing circuit, may be transmitted to the control circuit board.

In particular, at the time of injection molding, the molten mixture may be poured into the injection mold through a side gate in the horizontal direction. The melting analysis simulation is a tool for predicting the arrangement of the flake powder in the injection mold depending on the pouring direction when the molten mixture is poured into the injection mold.

The results of the melting analysis simulation show that when the molten mixture including the flake-shaped metal powder is poured into the injection mold in the horizontal direction, the flake powder is more uniformly stacked than when the molten mixture is poured into the injection mold in the vertical direction. Actual tests of the finished sandust block also show that at the time of horizontal pouring, i.e. pouring through the side gate, AC insulativity and permeability are better than at the time of vertical pouring, i.e. pin-point pouring.

As is apparent from the above description, embodiments have the following effects.

Embodiments provide a magnetic shielding member for a wireless power receiver and a method of manufacturing the same.

In addition, embodiments provide a magnetic shielding member exhibiting high AC insulativity and permeability.

In addition, embodiments provide a magnetic shielding member used to manufacture a wireless power receiver having a wireless power reception efficiency of 70% or more.

In addition, embodiments provide a wireless power receiver including a plurality of shielding members, thereby preventing energy loss, which is incurred when a conventional single shielding member is used, thus providing higher charging efficiency.

Effects obtainable from embodiments are not limited to the above-mentioned effects, and other unmentioned effects can be clearly understood from the following description by those having ordinary skill in the technical field to which the disclosure pertains.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A wireless power receiver comprising:
   a reception coil configured to wirelessly receive AC power;
   a first shielding member that is a magnetic shielding member having a thickness of 17 μm to 25 μm;
   a second shielding member that is a soft magnetic shielding member having a thickness of 0.1 mm or more;
   a first adhesive member disposed between the first shielding member and the second shielding member;
   a first flexible insulating cover layer disposed between the reception coil and the first and second shielding members; and
   a second flexible insulating cover layer disposed on the first adhesive member and the first and second shielding members,
   wherein the first adhesive member and the first and second shielding members are disposed between the first and second flexible insulating cover layers,
   wherein the first shielding member and the second shielding member are made of different materials and configured to block a magnetic field,
   wherein a ratio of the thickness of the first shielding member to the thickness of the second shielding member is approximately 1:5,
   wherein the first shielding member has a circular shape and a diameter of 30 mm or less,
   wherein the first adhesive member and the first and second magnetic shielding members are fully sealed between the first and second flexible insulating cover layers, and
   wherein a combination of the first and second shielding members has a magnetic permeability characterized in that a real part has a value of 300 or less and an imaginary part has a value of 20 or less in a low-frequency band of 300 KHz or less.

2. The wireless power receiver according to claim 1, wherein the first shielding member is one selected from between a nano-crystal shielding member and an amorphous shielding member.

3. The wireless power receiver according to claim 1, wherein the second shielding member is a sendust block formed by mixing and melting insulated flake powder and insulation resin powder.

4. The wireless power receiver according to claim 3, wherein the insulation resin powder is a polyimide-based or phenol-based resin powder.

5. The wireless power receiver according to claim 3, wherein the sendust block is injection molded by pouring a molten mixture of the insulated flake powder and the insulation resin powder in a horizontal direction.

6. The wireless power receiver according to claim 1, wherein the reception coil is one selected from between a patterned coil and a wound type coil.

7. The wireless power receiver according to claim 1, wherein the first and second flexible insulating cover layers both have a circular shape and a diameter that is larger than the diameter of the first shielding member.

8. The wireless power receiver according to claim 1, wherein an outer edge of the first flexible insulating cover layer is adhered to an outer edge of the second flexible insulating cover layers, and
   wherein the first adhesive member and the first and second magnetic shielding members are fully sealed between the first and second flexible insulating cover layers.

9. The wireless power receiver according to claim 1, wherein the second shielding member includes flake powder that is uniformly arranged in the horizontal direction.

10. A wireless power receiver comprising:
    a reception coil configured to wirelessly receive AC power;
    a first shielding member that is a magnetic shielding member having a thickness of 17 μm to 25 μm;
    a second shielding member that is a soft magnetic shielding member having a thickness of 0.1 mm or more;
    a first adhesive member disposed between the first shielding member and the second shielding member; and
    a first flexible insulating cover layer disposed between the reception coil and the first and second shielding members,
    wherein the first shielding member configured to block an imaginary part of the AC power differently than the second shielding member,
    wherein a ratio of the thickness of the first shielding member to the thickness of the second shielding member is approximately 1:5,
    wherein the first shielding member has a circular shape and a diameter of 30 mm or less,
    wherein the first adhesive member and the first and second magnetic shielding members are fully sealed between the first and second flexible insulating cover layers, and
    wherein a combination of the first and second shielding members has a magnetic permeability characterized in that a real part has a value of 300 or less and an imaginary part has a value of 20 or less in a low-frequency band of 300 KHz or less.

11. The wireless power receiver according to claim 10, wherein the second shielding member is a sendust block formed by mixing and melting insulated flake powder and insulation resin powder.

12. The wireless power receiver according to claim 10, wherein the reception coil is one selected from between a patterned coil and a wound type coil.

13. The wireless power receiver according to claim 10, wherein the first shielding member is one selected from between a nano-crystal shielding member and an amorphous shielding member.

14. A wireless power receiver comprising:
    a reception coil configured to wirelessly receive AC power;
    a first shielding member that is a magnetic shielding member having a thickness of 17 μm to 25 μm;
    a second shielding member that is a soft magnetic shielding member having a thickness of 0.1 mm or more;
    a first adhesive member disposed between the first shielding member and the second shielding member and adhering the first shielding member and the second shielding member to each other;
    a second adhesive member disposed between the first shielding member and the reception coil and adhering the first shielding member and the reception coil to each other, wherein the second adhesive member is a flexible insulating layer and electrically isolates the reception coil from the first shielding member, wherein the first shielding member and the second shielding member are made of different materials and configured to block a magnetic field, wherein a ratio of the thickness of the first shielding member to the thickness of the second shielding member is approximately 1:5, wherein the first shielding member has a circular shape and a diameter of 30 mm or less, wherein the first adhesive member and the first and second magnetic shielding members are fully sealed between the first and second flexible insulating cover layers, and wherein a combination of the first and second shielding members has a magnetic permeability characterized in that a real part has a value of 300 or less and an imaginary part has a value of 20 or less in a low-frequency band of 300 KHz or less.

15. The wireless power receiver according to claim 14, wherein the second shielding member is a sendust block formed by mixing and melting insulated flake powder and insulation resin powder.

16. The wireless power receiver according to claim 15, wherein the sendust block is injection molded by pouring a molten mixture of the insulated flake powder and the insulation resin powder in a horizontal direction.

17. The wireless power receiver according to claim 14, wherein the first shielding member is one selected from between a nano-crystal shielding member and an amorphous shielding member.

18. The wireless power receiver according to claim 14, wherein second adhesive member directly contacts the reception coil.

* * * * *